US007811384B2

(12) United States Patent
Bicker et al.

(10) Patent No.: US 7,811,384 B2
(45) Date of Patent: Oct. 12, 2010

(54) METHOD AND APPARATUS FOR TREATING SUBSTRATES IN A ROTARY INSTALLATION

(75) Inventors: Matthias Bicker, Mainz (DE); Stephan Behle, Gau-Odernheim (DE); Andreas Lüettringhaus-Henkel, Darmstadt (DE); Gregor Arnold, Bodenheim (DE); Juergen Klein, Mainz (DE)

(73) Assignee: Schott AG, Mainz (DE)

( * ) Notice: Subject to any disclaimer, the term of this patent is extended or adjusted under 35 U.S.C. 154(b) by 1133 days.

(21) Appl. No.: 11/148,740

(22) Filed: Jun. 9, 2005

(65) Prior Publication Data

US 2005/0284550 A1 Dec. 29, 2005

(30) Foreign Application Priority Data

Jun. 11, 2004 (DE) ....................... 10 2004 028 369

(51) Int. Cl.
*C23C 16/00* (2006.01)
*B05D 7/22* (2006.01)

(52) U.S. Cl. ................... 118/719; 118/718; 118/723 R; 204/298.28; 204/298.35; 422/186.05

(58) Field of Classification Search .................. 427/231
See application file for complete search history.

(56) References Cited

U.S. PATENT DOCUMENTS

| | | | | |
|---|---|---|---|---|
| 6,189,481 | B1 * | 2/2001 | Akimoto | 118/723 MW |
| 2006/0099340 | A1 * | 5/2006 | Behle et al. | 427/248.1 |

FOREIGN PATENT DOCUMENTS

| | | |
|---|---|---|
| DE | 10225607 | 12/2003 |
| DE | 10258681 | 2/2004 |
| WO | WO 03/100120 | 12/2003 |

* cited by examiner

*Primary Examiner*—Michael Cleveland
*Assistant Examiner*—Nathan K Ford
(74) *Attorney, Agent, or Firm*—Ohlandt, Greeley, Ruggiero & Perle, LLP

(57) ABSTRACT

The invention relates to a method and an apparatus for the treatment of substrates, in particular for the coating of plastic containers on a rotary installation. A plurality of treatment devices are arranged on the rotor and pass through a plurality of process phases as a function of their angle position on the rotor. For at least one process phase, the angle position can be set variably as a function of the current rotational speed of the rotor.

15 Claims, 2 Drawing Sheets

METHOD AND APPARATUS FOR TREATING SUBSTRATES IN A ROTARY INSTALLATION

CROSS-REFERENCE TO RELATED APPLICATIONS

This application claims the benefit under 35 U.S.C. §119 (a) of German Application Serial No. 10-2004-028369.9-45, filed Jun. 9, 2004, the entire contents of which are incorporated by reference herein.

BACKGROUND OF THE INVENTION

1. Field of the Invention

The invention relates to a method and an apparatus for treating substrates in a rotary installation, in particular for the uniform barrier coating of plastic containers in a rotary installation.

2. Description of Related Art

The processes for coating mass-produced products, such as for example food or pharmaceutical packaging material, plastics drinks bottles, etc., require high throughput with a high coating quality for industrial manufacture.

The plastics materials which are more and more often being used for these products have barrier coatings in order to reduce their permeability to gases and liquids and to protect them from chemical attacks or UV radiation. In this context, by way of example, it is of interest to deposit thin $SiO_x$ coatings or coating systems on polymer substrates, in order to reduce their permeability in particular to oxygen and water vapor and in particular at the same time to maintain the transparency of the material.

Coatings of this type can if appropriate also usefully be applied to glass vessels or glass substrates, for example in the field of pharmaceutical packaging products, in order to prevent the migration of alkali metal ions out of the glass.

The CVD (chemical vapor deposition) process, which can be used to produce very thin and uniform layers from a wide range of gas mixtures, has proven a particularly effective and inexpensive technique for the coating of substrates.

In general very thin, uniform layers can be produced under a low thermal load in particular by means of plasma impulse CVD processes, which makes these processes particularly suitable for plastics substrates. A further advantage of the pulsed plasma-enhanced processes consists in the fact that, by way of example, very pure inorganic barrier layers can be produced, since here, unlike with the processes with unpulsed plasma excitation, undesirable organic reaction products can be removed in the interpulse period, which means that a significantly lower level of organic constituents is incorporated in the layers.

For a coating process on substrates, such as for example a barrier coating on PET bottles, to be economical, it is necessary to realize very high throughputs. Typical throughputs required are approx. 10 000 bottles per hour.

To enable the required high throughputs to be realized, inter alia rotary installations are used, in which a plurality of coating stations for the products to be coated rotate on a circular path. In this case, the individual process phases during a revolution are assigned defined circle segments or angle regions.

An apparatus of this type is known, for example, from WO 00/58631, in which 20 identical treatment stations are arranged on a carousel conveyor. The distributor arrangement with a predetermined arrangement of openings defines the sector of the rotor in which a defined process phase takes place in a treatment station. The distributor arrangement comprises two coaxial rings, namely a stationary ring and a rotating ring. The rotating ring includes openings, which are each connected to a treatment station. The stationary ring has slots, each of which has a row of openings of the rotating ring on its path, so that a treatment station passes through the process phases in angle-referenced fashion. Therefore, it is not possible to vary the process sequence in any way.

This has an adverse effect in particular in the event of disruptions and fluctuations in the process sequence, since it is not possible to react flexibly to such events, which can lead to a drop in the quality of coating.

BRIEF SUMMARY OF THE INVENTION

Therefore, the invention is based on the object of realizing the treatment of substrates, in particular the coating of substrates with high throughputs in a stable and reliable way while satisfying the quality parameters required of the treated substrates, in particular the coating.

The object is achieved by a method and an apparatus provided by the present invention.

According to the invention, a plurality of process phases of a treatment cycle are passed through in a plurality of treatment devices positioned on a rotor, during one rotation of the rotor, with the process phases in a treatment device being controlled as a function of the angle position of this treatment device, and at least one angle section of a process phase being set as a function of the current rotational speed of the rotor within a predetermined angle section which is defined for a maximum rotational speed. A treatment cycle comprises at least the following process phases:

- introduction of at least one substrate into a treatment device,
- treatment of at least one substrate in a treatment device, and
- removal of the treated substrate(s) from the treatment device.

The apparatus according to the invention for the treatment of substrates has a plurality of treatment devices which are positioned on a rotor and pass through a plurality of process phases of a treatment cycle during one rotation of the rotor, each process phase being assigned an angle region of the rotor, and the rotor comprising at least the following angle regions:

- region for introduction of at least one substrate into a treatment device,
- region for treatment of at least one substrate in a treatment device, and
- region for removal of the treated substrate(s) from the treatment device, and moreover has a control device for setting at least one angle section as a function of the current rotational speed of the rotor within the predetermined angle region which is defined for a maximum rotational speed.

In particular, the angle region of a process phase may be set preferably as a function of the current rotational speed so that it is fully overlapped by the respective predetermined angle section which is defined for a maximum rotational speed. This is particularly advantageous, e.g. compared to a timed control, for multiple process phases set in such a manner.

If a timed control of several subsequent process phases is performed, which are executed in a predetermined timed sequence, at least the second time controlled process phase shifts in a manner that it does not longer lies completely within an angular section given for maximum speed, but at best only partly overlaps with the latter. This, however, may very disadvantageously influence the desired coating result and the overall process flow. For example, fixed positioned sensors then would detect the state of the reactors or the workpieces at different points of time in dependence of the revolution speed. In contrast thereto, according to the invention, the correlation between a predetermined treatment phase and defined angular sections is maintained.

This may also be achieved, if the anglular sections of several consecutive process phases at below maximum rotational speed are set by the control device such that an idle phase results between these phases. Thereby, however, it is not excluded that one or more further process phases are continued during the idle phase. For example, feeding of process gas and/or evacuation may continue during an idle phase between two coating steps in which a plasma is ignited.

According to a preferred embodiment of the invention, the process phase of the treatment of the substrate comprises a plasma treatment of the substrate, in particular a plasma coating comprising the process phases of:

evacuation of the spaces in the treatment device which are required for a coating operation, supplying of process gas, and ignition of a plasma, effecting coating of the substrate.

A treatment cycle may also comprise a plurality of coating operations with different coatings. A rotor then comprises angle sections assigned to these phases.

It is preferable for the setting of the angle section of the process phase—“ignition of a plasma”—to be set as a function of the current rotational speed of the rotor within the angle section of the process phase—“supplying of process gas”. For this purpose, the rotor is fixedly assigned an angle section for the process phase—“supplying of process gas”—which is set independently of the rotational speed of the installation. If it is desired to produce identical layer thicknesses for each coating operation, each coating operation should take place under identical process parameters. Therefore, with otherwise approximately constant process conditions, the coating time should also be kept constant. In the case of process control solely as a function of the angle position, this is only possible if the rotational speed of the rotor is very constant. However, for process and production reasons there are frequently delays or even stoppages or other forms of jams in the process sequence, and consequently a machine with a fixedly set constant rotational speed has to be stopped frequently. By way of example, delays may arise as a result of other machines within the process line, such as for example the blow-molding machine, the filler or the palettizer, having to be stopped briefly or only being able to work with a reduced throughput.

With the process control which is independent of rotational speed in accordance with the invention, by contrast, it is in many cases possible to prevent the coating installation from having to be temporarily shut down. This allows more efficient production in continuous operation.

If slowing of this type occurs, an angle section which ensures a constant coating time is set as a function of the current rotational speed.

In this context, it is expedient for the supply of process gas not to be interrupted or varied, since this would entail fluctuations in process conditions which are set to a steady state, but rather just to vary the instant of ignition of the plasma. Therefore, by way of example, only the angle section for the process phase—“ignition of a plasma”—is set as a function of the current rotational speed, preferably in such a way that the angle position for the end of the process phase—“ignition of a plasma”—, for at least the last coating operation of a treatment cycle, corresponds to the angle position for the end of the process phase—“supplying of process gas”. This simultaneously ensures that the plasma is completely converted at least in the final coating operation, and no undesirable process gases remain in the coated container. For the coating of food or pharmaceutical packaging products, it is imperative that the containers should not contain any unconsumed process gases. This requirement is satisfied in a surprisingly simple way by the process sequence described in the present invention.

In a further preferred embodiment of the invention, the method comprises the coating of plastic hollow bodies with a barrier layer from the inside and/or the outside. For this purpose, in a treatment cycle, at least the following process phases are passed through:

introduction of at least one hollow body into a treatment device, evacuation of the treatment device in the region of the space outside the hollow body as far as a first pressure value, evacuation of the interior of the hollow body as far as a second pressure value, which is lower than the first pressure value, supplying of a first process gas for a bonding layer, ignition of a plasma, effecting the coating of the hollow body with a bonding layer, supplying of a second process gas for a barrier layer, ignition of a plasma, effecting the coating of the hollow body with a barrier layer, venting of the treatment device and of the hollow body, and removal of the coated hollow body/bodies from the treatment device.

A rotor of an apparatus according to the invention then has angle regions assigned to the corresponding process phases.

In addition to the setting of the angle sections described above, it is in this context also possible for the angle position at the start of the process phase—“evacuation of the interior of the hollow body as far as a second pressure value”—to be set variably, as a function of the current rotational speed of the rotor, with respect to the angle position at the start of the process phase—“evacuation of the treatment device in the region of the space outside the hollow body as far as a first pressure value”—so that a fixed delay time is realized between these process phases. This ensures, irrespective of fluctuations in the rotational speed of the rotor, that the pressure difference between the pressure in the interior of the hollow body and the pressure in the treatment chamber remains identical and the process parameters for the coating are kept stable.

If all the treatment devices are connected to at least one common pump device via distributor lines, the pump device can be fixedly connected to the treatment devices, and an increased throughput can be realized. In this embodiment, the pump device can also rotate on the rotor, which means that there is no need for a complex rotating connection, which is difficult to seal, or a pump-side rotary slide leadthrough.

As described above, the evacuation of the individual treatment devices is controlled by a control device, which controls the corresponding association between the pump device and the individual treatment devices in accordance with the current process phase by means of the valves arranged in the distributor lines.

It is preferable for the evacuation of the treatment devices during the corresponding process phases to be carried out by a common pump device and for the evacuation of the hollow bodies to be carried out by a further common pump device, it being possible for the two pump devices to be controlled independently of one another.

Each common pump device may comprise a plurality of pumps with different pressure ranges, making it easy to implement cascaded or stepped evacuation of the treatment device or hollow bodies.

In a further preferred embodiment, the process gas is fed to the treatment devices by means of at least one common process gas supply device during the corresponding process phases, the process gas supply device being connected to the individual treatment stations via distributor lines, and the supply of process gas to the individual treatment stations being controlled by valves.

If different process gases are used, as is the case, for example, for barrier coating of plastic hollow bodies with a bonding/barrier layer combination, each process gas is supplied by means of in each case a separate common process gas supply device. The process gas supply devices contain, for example, the base materials for production of the coatings or other gases required for the process.

In a preferred embodiment of the invention, the coating operation is carried out by means of plasma-enhanced vapor deposition, by the ignition of a plasma by means of microwave energy, preferably by means of pulsed microwave energy.

It is preferable for each substrate to pass through the same treatment cycle, so that in a continuous method sequence every treatment device permanently contains at least one substrate and is passing through a process phase, with every treatment device passing through all the process phases and one treatment device changing over to the process phase or process phases of a treatment device ahead.

In the case of rotary installations with common pump devices and/or common process supply devices, when the installation is starting up there are as yet no defined process conditions, since defined pressure and flow conditions have only been established in the distributor lines and treatment chambers after all the treatment devices have passed through all the process phases. To avoid coating of inadequate quality, it is preferable, prior to the introduction of the first substrates into a treatment device when starting a continuous method sequence, for every treatment device to pass through every process phase at least once without a substrate. During this initial operation, the plasma is not ignited, in order not to coat the treatment chamber. Typically, at least two to three revolutions are required to set stable process conditions, i.e. stable pressures and flows in all the chambers.

This procedure can also be employed in the event of faults, for example if the installation cannot be supplied continuously with substrates. In this case, the treatment devices pass through the process phases empty, with the ignition of the plasma being suppressed here. As a result, the overall process is not interrupted, and the pressure/flow conditions in the installation are kept constant.

BRIEF DESCRIPTION OF THE SEVERAL VIEWS OF THE DRAWINGS

The text which follows provides a more detailed explanation of the invention on the basis of an exemplary embodiment and with reference to the drawings, in which.

DETAILED DESCRIPTION OF THE INVENTION

Figure 1:
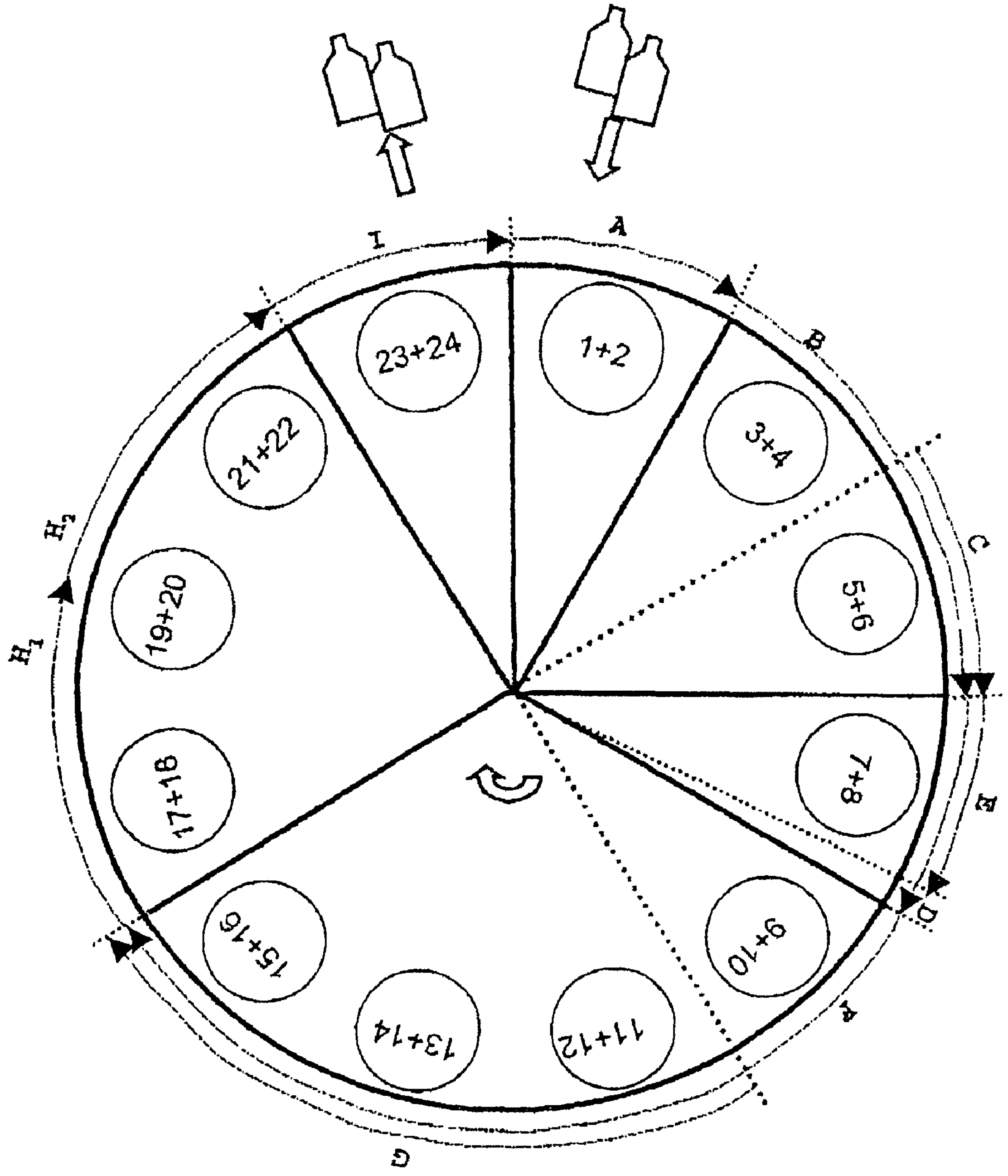
FIG. 1 diagrammatically depicts the process sequence with associated angle sections of the rotor, FIG. 2 diagrammatically depicts an example of an apparatus.

The diagrammatic illustration of the process sequence of an operation for coating hollow bodies (1, 2, . . . , 24) shown in FIG. 1 shows the individual process phases (A, B, . . . , I) and the corresponding angle sections on the rotor. Angle sections illustrated by solid lines are fixed angle sections. The angle sections illustrated by dotted lines can be set variably as a function of the current rotational speed of the rotor. Twelve identical treatment stations (101, 102, . . . , 112) are arranged at regular intervals of 30° on the rotor. Each treatment station (101, 102, . . . , 112) passes through the entire treatment cycle comprising the process phases (A, B, . . . , I) and the correspondingly associated angle sections:

- introduction of the hollow bodies (A),
- evacuation of the treatment device in the region of the space outside the hollow body (B),
- evacuation of the interior of the hollow bodies (C),
- supplying of process gas for bonding agent (D),
- ignition of plasma for bonding agent (E),
- supplying of process gas for barrier layer (F),
- ignition of plasma for barrier layer (G),
- venting of the interior of the hollow bodies (H1),
- venting of the treatment device (H2), and
- removal of the hollow bodies (I).

Figure 2:
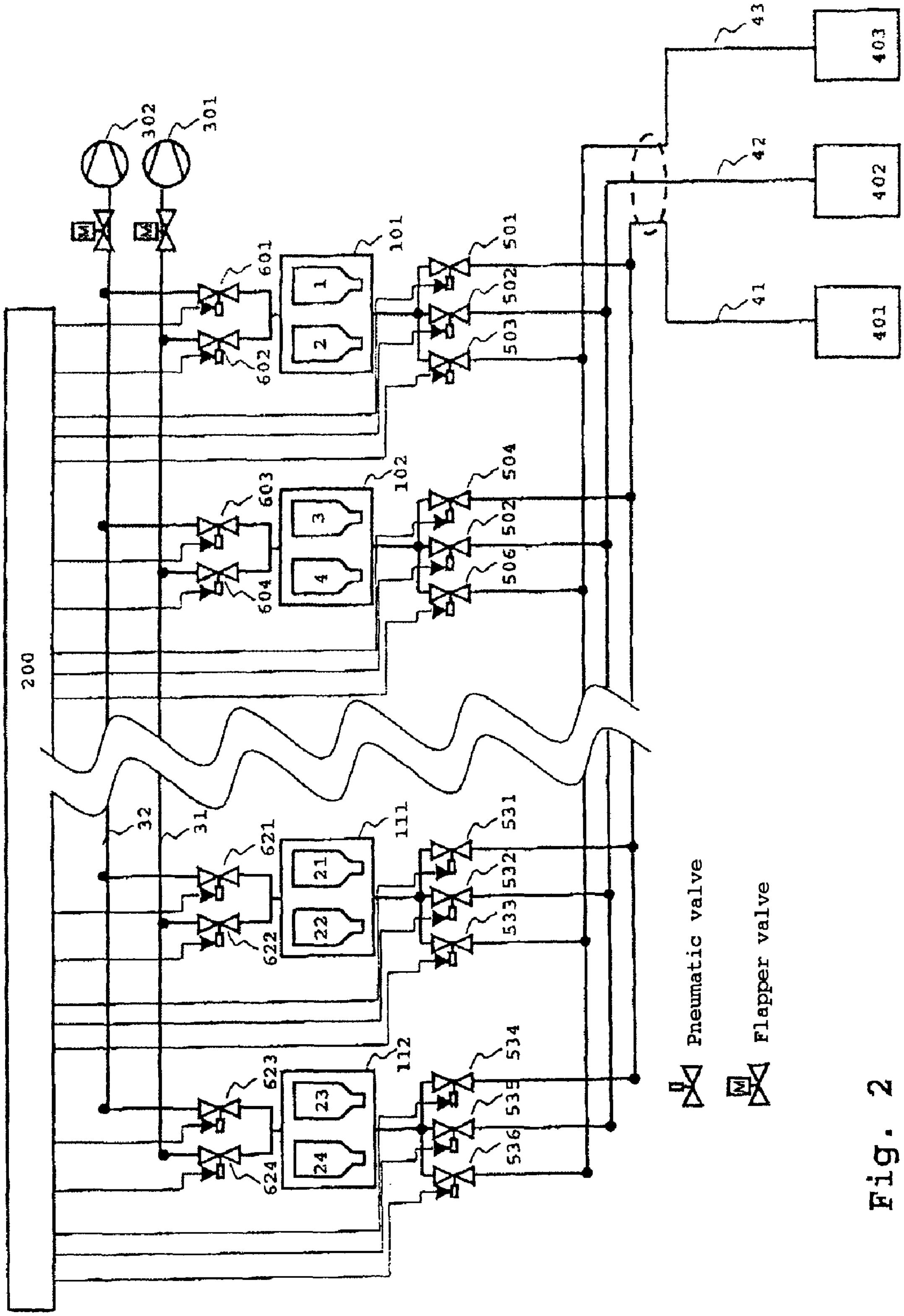

FIG. 2 diagrammatically depicts a rotary installation for coating hollow bodies (1, 2, . . . , 24) by means of the arrangement of 12 treatment devices (101, 102, . . . , 112) illustrated in FIG. 1 and the treatment cycle illustrated in FIG. 1.

Every treatment device (101, 102, . . . , 112) positioned on the rotor (not illustrated in FIG. 2) can accommodate two hollow bodies (1, 2, . . . , 24), in particular PET bottles for coating, in particular for internal coating with a barrier layer. The provision of two substrates per treatment device (101, 102, . . . , 112) is only an example, and a different number is equally feasible.

Moreover, the first common pump device (301), which is connected to each treatment device (101, 102, . . . , 112) via the distributor line (31), and the second common pump device (302), which is connected to each treatment device (101, 102, . . . , 112) via the distributor line (32), are arranged on the rotor and can therefore also rotate with the rotor.

The distributor lines (31, 32) have valves (601, 602, . . . , 624), which each control the connection of each pump device (301, 302) to each treatment device (101, 102, . . . , 112) separately and as a function of the respective process phase (A, B, . . . , I). The valves (601, 602, 624) can be controlled individually by the control device (200).

The pump devices (301, 302) may comprise a plurality of pump stages which are assigned to different pressure ranges. The pump stages can be realized by one pump, e.g. by a Roots pump, with one distributor line, as illustrated in the exemplary embodiment shown in FIG. 2, or by a plurality of pumps with a plurality of separate distributor lines.

The process gas supply devices (401, 402, 403) are arranged in a stationary position in the rotary installation, so that the supply vessels containing the base materials can be changed without stopping the rotor.

The process gas supply devices (401) for the bonding agent is connected to each treatment device (101, 102, . . . , 112) via the distributor line (41). The process gas supply device (402) for the barrier layer is connected to each treatment device (101, 102, . . . , 112) via the distributor line (42), and the process gas supply device (403) for the purge gas is connected to each treatment device (101, 102, . . . , 112) via the distributor line (43). The distributor lines (41, 42, 43) have valves (501, 502, . . . , 536), which each control the connection of each process gas supply device (401, 402, 403) to each treatment device (101, 102, . . . , 112) separately and as a function of the respective process phase (A, B, . . . , I). The valves (501, 502, . . . , 536) can be controlled individually by the control device (200). The distributor lines (41, 42, 43) are connected to the stationary process gas supply devices (401, 402, 403) by means of rotatable sealing connections.

The process gas supply device for the bonding agent (401) provides a gas mixture of hexamethyldisiloxane (HMDSO) and oxygen, which on ignition of a plasma forms an $SiO_xC_y$ bonding layer.

The process gas supply device for the actual barrier layer (402) provides a gas mixture of hexamethyldisilazane (HMDSN) and oxygen, which on ignition of a plasma forms a transparent $SiO_x$ barrier layer.

As alternative technical solutions, however, it is also possible to use a gas mixture of hexamethyldisiloxane (HMDSO) and oxygen for the production of the barrier layer. A further solution would be to produce a bonding and/or barrier layer from amorphous carbon by means of hydrocarbon gas or a mixture of hydrocarbon with one of the abovementioned gases. In addition, it is also possible for a nitrogen-containing gas to be admixed with one of the abovementioned gas mixtures.

The process gas supply device (403) provides a purge gas, for example oxygen, nitrogen and/or dried air, to remove unused gas in the venting phase, and is optional for the overall process.

Each treatment device (101, 102, . . . , 112) has a reactor with two treatment places; it is also possible for each treatment device (101, 102, . . . , 112) to be equipped with two reactors. To ignite a plasma and to realize a pulsed plasma-enhanced CVD process, pulsed microwave energy is introduced into the reactors. For this purpose, each treatment device (101, 102, . . . , 112) is assigned a radiofrequency source which ignites the plasma in the reactor or in the two reactors simultaneously.

Starting Phase:

After interruptions to the process for a very wide variety of reasons, the coating of the PET bottles has to be started again. At this point, the treatment devices (101, 102, . . . , 112) are empty.

Before the first two hollow bodies (1, 2) are introduced into the first treatment device (101), the process gases for the bonding agent, for the barrier coating and the purge gas are fed from the process gas supply devices (401, 402, 403) via the corresponding distributor lines (41, 42, 43) to the treatment devices (101, 102, . . . , 112), and the two pump devices (301, 302) are switched on. For this purpose, the empty treatment devices (101, 102, . . . , 112) pass through the process phases (A, B, . . . , I) at least once without a plasma being ignited. The process gases are supplied and the two pump devices (301, 302) switched on analogously to the predetermined treatment cycle and the corresponding defined and controllable angle sections in accordance with FIG. 1. As a result, a steady pressure/flow equilibrium is established in the treatment devices (101, 102, . . . , 112).

After a steady pressure/flow equilibrium has been set, the first two hollow bodies (1, 2) are fed to the first treatment device (101). The first treatment device (101) is defined as the treatment device which is located in the angle region of the process phase—"introduction of the hollow bodies (A)"—when the first two hollow bodies (1, 2) are supplied.

When the first treatment device (101) containing the two hollow bodies (1, 2) has passed through all the process phases (A, B, . . . , I) for the first time, there are two hollow bodies in each of the treatment devices within phases B to H2—assuming a continuous sequence—and as the continuous process sequence then progresses further, each treatment device (101, 102, . . . , 112) containing in each case two hollow bodies (1, 2, . . . , 24) passes through all the process phases (A, B, . . . , I) in accordance with the predetermined and adjustable angle regions.

Continuous Sequence of the Process Phases:

The following text explains the continuous sequence of the process phases with reference to the first treatment device (101). As can be seen from FIG. 1, all the treatment devices (101, 102, . . . , 112) pass through all the phases in succession at intervals of 30°.

When the treatment device (101) is passing through the fixedly set angle section of 30° of the process phase—"introduction of the hollow bodies (A)"—during a time $T_A$ which is dependent on the current rotational speed of the rotor, two hollow bodies (1, 2) are introduced into the treatment device (101).

The angle section for the process phase—"evacuation of the hollow bodies (C)"—can be adjusted within the fixedly set angle section of 60° for the process phase—"evacuation of the treatment device (B)"—as a function of the current rotational speed of the rotor. A fixed delay time $T_{VER}$ should be realized between the two process phases (B, C), in order to generate a pressure difference between body cavity and outside space which remains constant irrespective of the rotational speed of the machine. For this purpose, the valve (601) which controls the evacuation of the treatment device (101) is opened at the start of the process phase—"evacuation of the treatment device (B)"—and the outside space of the treatment device (101) is evacuated over the course of a period of time $T_{EB}$ which is constant and therefore independent of the current rotational speed of the rotor. At the same time, the control device (200) determines an angle section for the process phase—"evacuation of the interior of the hollow bodies (C)"—as a function of the current rotational speed of the rotor, corresponding to a time $T_{EH}$, where $T_{EB}-T_{EH}=T_{VER}$=constant, so that a constant delay time $T_{VER}$ can be set. The valve (601) which controls the evacuation of the hollow body is opened with a corresponding delay. This prevents the bottles from being deformed by excessively high pressure differences irrespective of the rotational speed of the machine, and a constant pressure level for the base pressure is achieved.

The evacuation is followed by the first coating process, which comprises the process phases—"supplying of process gas for bonding agent (D)"—and—"ignition of plasma for bonding agent (E)". A constant delay time $t_{verz}$ between the admission of the gas and the ignition of the plasma is used. Under normal circumstances, with completely constant process parameters, these two phases could take place completely in parallel from the ignition of the plasma, and the plasma could burn in a fixedly set way over an angle section of, for example, 25°. However, delays in the process sequence or other faults often slow down the rotational speed of the rotor, with the result that with a fixed angle section of 30° the coating time $T_B$ is lengthened, which leads to undesirable layer thicknesses. This alters the quality of the coating. If the coating is interrupted prematurely as a result of the two phases being shortened, unstable pressure/flow rate conditions would occur in the treatment devices (101, 102, . . . , 112). Therefore, the treatment device (101) is supplied with the process gas over the entire angle section of 30°, but the angle section for the process phase—"ignition of plasma for bonding agent (E)"—is determined as a function of the current rotational speed of the rotor and set variably within the process phase—"supplying of process gas for bonding agent (D)"—so that if the rotor slows down the angle section is correspondingly shortened, and a constant coating time $T_B$ is realized. Thereby, the angular section (E) of this process phase is set in dependence of the current rotational speed of the rotor so that it is fully covered by the predetermined angular section of 30° which is defined for maximum rotational speed. Furthermore, at least one idle phase for the process of plasma ignition results. Thereby, an idle phase may succeed and/or antecede to the process phase (E). The valve (503) for controlling the supply of process gas to the bonding agent remains open during passage through the fixed angle section of the process phase—"supplying of process gas for bonding agent (D)"—, thus as well during an idle phase for the process of plasma ignition, and the plasma is ignited in accordance with the variable angle section determined. In this case, the ignition may begin immediately after a short delay time $t_{verz}$ after the supply of gas and can end simultaneously with the latter or alternatively may begin later and end earlier. A corresponding control is effected by means of the control device (200).

Then, the treatment device (101) switches to the second coating process, which comprises the process phases—"supplying of process gas for barrier layer (F)"—and "ignition of plasma for barrier layer (G)". The angle sections are set in a similar way to in the first coating process, with the fixed angle section for the process phase—"supplying of process gas for barrier layer (F)"—amounting to, for example, 120°. Moreover, it is advantageous if the two phases in the final coating process end together, since this means that no process gas remains in the hollow body (1, 2).

The last two process phases—"venting (H)"—and—"removal of the hollow bodies (I)"—take place in fixed angle sections in accordance with FIG. 1.

The venting is divided into the substeps, which are offset in terms of time but in part take place in parallel—"venting of the interior of the hollow bodies (H1)"—and—"venting of the treatment device (H2)". In this context, first of all the interior of the bottle is vented, and after a fixed delay time $t_{Verz}$ the treatment device is vented. The sequence takes place in such a manner that a constant delay time between the substeps is always used irrespective of the rotational speed of the machine.

During the venting, the hollow body (1, 2) can also be purged with a purge gas which is provided by opening the valve (503).

A continuous sequence also arises if, on account of a different design, one or more treatment devices (101, 102, . . . , 112) pass through all the process phases (A, B, . . . , I) without any hollow bodies.

The coating which is implemented here can equally well be carried out for external and/or internal coatings. For external coating, the process sequences would be switched, such that the gases are passed into the outside space and the plasma is ignited in this region, while a suitable pressure in the interior prevents the ignition of a plasma.

The barrier coating process, described by way of example, for PET bottles is stable with respect to fluctuations in parameters and fluctuations in process time of up to approx. 10%, with an $O_2$ BIF of at least 1.5, preferably even of more than 10, being achieved. This oxygen barrier improvement factor ($O_2$ BIF) is achieved, for example, for PET bottles which without a coating have an oxygen permeation of 0.20 $cm^3$/(Pck d bar) and with a barrier coating have an oxygen permeation which has been reduced by a factor of greater than 10.

LIST OF DESIGNATIONS

A Introduction of the hollow bodies
B Evacuation of the treatment device
C Evacuation of the hollow bodies
D Supplying of process gas for bonding agent
E Ignition of plasma for bonding agent
F Supplying of process gas for barrier layer
G Ignition of plasma for barrier layer
H1 Venting of the interior of the hollow bodies
H2 Venting of the treatment device
I Removal of the hollow bodies
1 to 24 Substrate/hollow body
101 to 112 Treatment device
200 Control device
31 Distributor line for first pump device
32 Distributor line for second pump device
301 First pump device
302 Second pump device
41 Distributor line for process gas for bonding agent
42 Distributor line for process gas for barrier layer
43 Distributor lines for purge gas
401 Process gas supply device for bonding agent
402 Process gas supply device for barrier layer
403 Process gas supply device for purge gas
501 to 536 Valves for controlling the gas supply
601 to 624 Valves for controlling the evacuation

The invention claimed is:

1. An apparatus for treating substrates, comprising:

a plurality of treatment devices positioned on a rotor and passing through a plurality of process phases of a treatment cycle during one rotation of the rotor, each process phase being assigned an angle region of the rotor, and the rotor comprising at least an introduction region, a treatment region, and a removal region; and a control device that determines a current rotational speed of the rotor, sets a starting point or an ending point of each of the plurality of process phases at a predetermined angle within the angle region such that a process phase lasts a constant time interval, and calculates the ending point or starting point of the constant time interval as a function of the current rotational speed irrespective of fluctuations in the current rotational speed of the rotor.

2. The apparatus as claimed in claim 1, wherein the treatment region comprises a plasma treatment region.

3. The apparatus as claimed in claim 2, wherein the plasma treatment region further comprises an evacuation region, a process gas supply region, and a plasma ignition region.

4. An apparatus for treating substrates, comprising:

a plurality of treatment devices positioned on a rotor and passing through a plurality of process phases of a treatment cycle during one rotation of the rotor, each process phase being assigned an angle region of the rotor, and the rotor comprising at least the following angle regions:

a region for introduction of at least one substrate into a particular one of the plurality of treatment devices, a region for treatment of the at least one substrate in the particular one of the plurality of treatment devices, and a region for removal of the treated substrate; and a control device for controlling the plurality of process phases within an angle region such that the process phase lasts a constant time interval irrespective of fluctuations in a current rotational speed of the rotor, the control device setting a starting point or an ending point of the process phase at a predetermined angle within the angle region, and calculating the ending point or starting point of the constant time interval as a function of the current rotational speed.

5. The apparatus as claimed in claim 4, wherein the region for treatment comprises a region for plasma treatment of the at least one substrate.

6. The apparatus as claimed in claim 5, wherein the region for plasma treatment comprises a region for evacuation of the spaces in the plurality of treatment devices that are required for a coating operation, a region for supplying of process gas, and a region for ignition of a plasma, in which coating of the at least one substrate takes place.

7. The apparatus as claimed in claim 6, wherein the plurality of treatment devices are connected to at least one common pump device via distributor lines and the distributor lines have valves for controlling the evacuation of the plurality of treatment devices.

8. The apparatus as claimed in claim 7, wherein the at least common one pump device is arranged on the rotor.

9. The apparatus as claimed in claim 6, wherein the plurality of treatment devices are connected to at least one common process gas supply device via distributor lines and the distributor lines have valves for controlling the supply of process gas.

10. The apparatus as claimed in claim 9, further comprising a separate common process gas supply device for each process gas connected to the plurality treatment devices.

11. The apparatus as claimed in claim 6, wherein the treatment devices have devices for the ignition of a plasma by microwave energy.

12. The apparatus as claimed in claim 11, wherein the treatment devices have devices for the pulsed ignition of a plasma by microwave energy.

13. The apparatus as claimed in claim 4, wherein the at least one substrate is a hollow body.

14. The apparatus as claimed in claim 4, wherein the at least one substrate is a plastic hollow body.

15. The apparatus as claimed in claim 14, wherein the region for treatment comprises:

a region for evacuation of the treatment device to a first pressure value, a region for evacuation of an interior of the plastic hollow body to a second pressure value, which is lower than the first pressure value, a region for supplying of a first process gas for a bonding layer, a region for ignition of a plasma, effecting the coating of the plastic hollow body from the inside with a bonding layer, a region for supplying of a second process gas for a barrier layer, a region for ignition of a plasma, effecting the coating of the hollow body from the inside with a barrier layer, and a region for venting the treatment device.

* * * * *